United States Patent [19]
Holesinger

[11] Patent Number: 5,958,842
[45] Date of Patent: Sep. 28, 1999

[54] MELT PROCESSING OF BI—2212 SUPERCONDUCTORS USING ALUMINA

[75] Inventor: Terry G. Holesinger, Los Alamos, N.Mex.

[73] Assignee: The Regents of the Uniersity of California, Los Alamos, N.Mex.

[21] Appl. No.: 08/608,069

[22] Filed: Feb. 28, 1996

[51] Int. Cl.$^6$ .................................................. H01L 39/24
[52] U.S. Cl. ...................... 505/450; 505/452; 505/430; 505/433; 505/733; 505/782; 505/785
[58] Field of Search .................................. 505/450, 433, 505/733, 430, 782, 785, 452; 427/62

[56] References Cited

U.S. PATENT DOCUMENTS 5,284,822   2/1994   Sakai et al. ................................. 505/1

OTHER PUBLICATIONS

T.G. Holesinger, et al., Solidification of $Bi_2Sr_2CaCu_2Oy$ and $Bi_2Sr_{1.75}Ca_{0.25}CuO_y$, J. Mater. Res., vol. 8, No. 9, Sep. 1993, pp. 2149–2161.

T.G. Holesinger, et al., Processing of Bi—Sr—Ca—Cu—O glasses using platinum and alumina crucibles, J. Mater. Res., vol. 7, No. 8, Aug. 1992, pp. 2035–2039.

T.G. Holesinger, et al., Crystallization of Bi—Sr—Ca—Cu—O glasses in oxygen, J. Mater. Res., vol. 7 No. 7, Jul. 1992, pp. 1658–1671.

K.C. Goretta, et al., Reactive Nanophase Oxide Additions to Melt–Processed High–$T_c$ Superconductors, Jun. 1995, IEEE Transactions on applied Superconductivity vol. 5, No. 2, pp. 1309–1312.

T.G. Holesinger, et al., Relationships Between Processing Temperature and Microstructure in Isothermal Melt Processed Bi–2212 Thick Films, Jun. 1995, IEEE Transactions on Applied Superconductivity, vol. 5 p. 193–19.

T.G. Holesinger, et al., Isothermal melt processing of Bi–2212 thick films, Nov. 1994, Physica C 243 (1995) pp. 93–102 no month data.

T.G. Holesinger, et al., Directional isothermal growth of highly textured $Bi_2Sr_2CaCu_2O_y$, Appl. Phys. lett. 63(7), Aug. 1993 pp. 982–984.

T.G. Holesinger, et al., $Al_2O_3$ Additions for Melt Processing of $Bi_2Sr_2CaCu_2O_y$, MRS Mtg Fall 1995 Abstract no page data.

T.G. Holesinger, et al., Isothermal melt processing of Bi2Sr2CaCu2Oy round wire, Physica C, Aug. 1995, pp. 182–190.

J. Bock and E. Preisler, Melt Processing of Bi–HT superconductors: The Significance of Oxygen for Formation and Properties, May 1990, Garmisch–Partenkirchen no page data.

J. J. Lin, et al., Electrical transport and superconductivity in the $Al_2O_3$—$Bi_2Sr_{1.8}Ca_{1.2}Cu_2O_y$ and MgO—$Bi_2Sr_{1.8}Ca_{1.2}Cu_2O_y$ composites, Physica C 210 (1993) pp. 455–462 no month data.

Kasuga et al, Journal of Crystal Growth 144 (1994) p. 375–379 no month.

Abe et al, J. Mater. Res., vol. 7, No. 7, Jul. 1992, p. 1599–1601.

Kasuga et al, J. Mater. Res., vol. 9, No. 5, May 1994, p. 1098–1103.

Yoshida et al, Jpn. J. Appl. Phys. vol. 32, No 108, Oct. 1993 pp. L1509–1512.

Dietderich et al, Jpn. J. Appl. Phys. vol. 29, No. 7, Jul. 1990, L1100–1103.

*Primary Examiner*—Roy V. King
*Attorney, Agent, or Firm*—Bruce H. Cottrell

[57] ABSTRACT

Superconducting articles and a method of forming them, where the superconducting phase of an article is $Bi_2Sr_2CaCu_2O_y$(Bi-2212). Alumina is combined with Bi-2212 powder or Bi-2212 precursor powder and, in order to form an intimate mixture, the mixture is melted and rapidly cooled to form a glassy solid. The glassy solid is comminuted and the resulting powder is combined with a carrier. An alternative to melting is to form the mixture of nanophase alumina and material having a particle size of less than about 10 microns. The powder, with the carrier, is melt processed to form a superconducting article.

13 Claims, No Drawings

MELT PROCESSING OF BI—2212 SUPERCONDUCTORS USING ALUMINA

This invention was made with government support under Contract No. W-7405-ENG-36 awarded by the U.S. Department of Energy. The government has certain rights in the invention.

FIELD OF THE INVENTION

This invention relates to the field of ceramic cuprate superconductors and, more particularly, to melt processing of materials to form superconductive bodies.

BACKGROUND OF THE INVENTION

Superconductors are materials which have no resistance to flow of electricity. Some applications of superconductive materials are power transmission lines, electric motors and generators, current leads, nuclear magnetic resonance analyzers, and magnets for use in levitated vehicles, energy storage systems, particle accelerators, and magnetic separation of materials. This invention deals with Bi—Sr—Ca—Cu—O (BSCCO) superconductors. One of the superconducting phases of the BSCCO system is $Bi_2Sr_2CaCu_2O_y$. This phase is commonly termed Bi-2212, referring to the ideal stoichiometry, though this superconducting phase actually has a range of compositions. Bi-2212 may be viewed as a region on a three-dimensional phase diagram of the BSCCO system. Further information may be found in T.G. Holesinger et al., "Solid Solution Region of the $Bi_2Sr_2CaCu_2O_y$ Superconductor", *Physica* C 217 (1993) pp. 85–96.

Melt processing may be utilized in producing superconductive articles of Bi-2212 from Bi-2212 powders or powders comprised of Bi-2212 precursors. A powder is combined with a carrier, such as a silver tube, a substrate, or a container and subjected to melt processing and other operations to form a useful superconductive article. One method of forming such an article is termed the powder-in-tube (PIT) process. A tube of silver or silver alloy is filled with powder, sealed at the ends, mechanically deformed, and then subjected to melt processing. Mechanical deformation involves drawing through dies to form a wire and/or passing through rollers to form a tape. In another method of forming a superconductive article, a powder may be mixed with a liquid and disposed on a substrate to form a thick or thin film and the resulting assembly subjected to melt processing conditions to form the article. Another method of forming a superconductive article from powder is to place the powder in a container and melt process it. The resulting solid body may be removed from the container or the container may remain a part of the superconductive article.

Melt processing of Bi-2212 superconductive powder or precursor powder is accomplished by subjecting the powder or an assembly comprised of the powder to high temperatures and holding at those temperatures, preferably in a controlled atmosphere. The powder is partially melted and the assembly is cooled in such manner as to form a crystalline solid having superconductive phases. A problem which arises in melt processing of a Bi-2212 superconductor is incongruent melting, that is, the powder transforms into liquid phases and crystalline phases. Then, upon cooling, it is difficult to cause the material to transform into the superconducting phase. A further problem is the phase segregation which occurs upon melting. Several of the solid phases present when Bi-2122 is partially melted are less dense than the liquid phase and, therefore, migrate to the top portion of the partial melt. Such phase segregation makes it difficult to form a large amount of the superconducting phase upon cooling. Both of these problems adversely affect the superconducting properties of Bi-2212.

BRIEF SUMMARY OF THE INVENTION

Superconducting articles and a method of forming them, where the superconducting phase of an article is $Bi_2Sr_2CaCu_2O_y$ (Bi-2212). Alumina is combined with Bi-2212 powder or Bi-2212 precursor powder and, in order to form an intimate mixture, the mixture is melted and rapidly cooled to form a glassy solid. The glassy solid is comminuted and the resulting powder is combined with a carrier. An alternative to melting is to form the mixture of nanophase alumina and material having a particle size of less than about 10 microns. The powder, with the carrier, is melt processed to form a superconducting article.

It is an object of this invention to provide an improved method for melt processing of Bi-2212.

Another object of the invention is to provide a Bi-2212 superconductor having improved current transport properties.

In one embodiment, this invention is a superconductive composition comprised of a crystalline material having a superconducting phase consisting essentially of $Bi_2Sr_2CaCu_2O_y$ and non-superconducting phases containing aluminum, where said crystalline material contains less than about 2.6 weight % aluminum.

In another embodiment, this invention is a method of forming a superconducting article comprising forming a mixture of aluminum oxide and a material comprised of bismuth, strontium, calcium, copper, and oxygen, where the quantities of said substances of said mixture are effective to form $Bi_2Sr_2CaCu_2O_y$; heating the mixture to a temperature effective to melt it; cooling the mixture in a manner effective to form an amorphous material and grinding said amorphous material to form a powder; combining said powder and a carrier to form an assembly; and subjecting said assembly to conditions effective to melt process the powder, thereby forming a superconducting article comprised of $Bi_2Sr_2CaCu_2O_y$.

DESCRIPTION OF THE INVENTION

Addition of alumina to a powder which is to be melt processed to form Bi2212 causes dramatic changes in the phase assemblage of the resulting melt processed article. Large secondary, or non-superconducting, phases which normally form are replaced, in articles formed from powder to which a small amount of $Al_2O_3$ has been added, with smaller dispersed secondary phases.

Preferential growth of secondary phases is prevented by alumina addition and melt processed material reaches a true equilibrium microstructure. During prior art melt processing, several alkaline earth cuprate phases develop in the partial melt. These phases can grow, depending on processing conditions, to sufficient sizes that they become metastable and are not completely consumed on cooling through the peritectic to form Bi-2212. At other processing conditions, large grains of CaO and a copper-free phase may form, leading to development of other secondary phases in fully processed material. Alumina acts as a grain refiner and does not substitute into the superconducting phase. It is present as small secondary grains of approximate compositions $Sr_{2-x}Ca_xAlO_y$ and $Bi_2Sr_{4-x}Ca_xAl_3O_y$.

This invention has been demonstrated to be effective in melt processing to form solid bulk superconductors, superconductive films on substrates, and wire formed by PIT procedures. It is expected to be effective in producing superconductive articles in any form in which Bi-2212 powder is a starting material. In conventional melt processing, a powder is placed in or on a carrier and held at an elevated temperature effective for formation of a partial melt. The temperature is then slowly reduced to a lower value in order to initiate crystal growth and the article held at the lower temperature in order to allow completion of phase growth to take place. Conventional melt processing of alumina-containing Bi-2212 powder is preferably accomplished by holding at a temperature of from about 880 to about 920° C. for about 15 min. to about 25 hours and then reducing the temperature at a rate of from about 0.1 to about 5° C./min to a temperature of from about 820 to about 860° C., then holding at the lower temperature for from about 1 to about 200 hours. This is normally done in air, but may be done in an oxygen/inert gas atmosphere.

However, it is highly desirable to melt process at lower temperatures. Practice of this invention facilitates isothermal melt processing of Bi-2212 powder. Preferred temperatures for isothermal processing of alumina-containing Bi-2212 are from about 750 to about 860° C. To accomplish isothermal melt processing, an assembly comprised of powder and carrier is held at temperature in an inert gas atmosphere (such as argon or nitrogen) for from about 15 min. to about 25 hours. Then, the composition of the atmosphere is changed to include oxygen in order to induce solidification of the partial melt and the assembly is held at temperature for an additional period of from about 15 min. to about 200 hours. The amount of oxygen in the processing atmosphere may be varied in accordance with the character of the article. For example, 100% oxygen is desirable for bulk superconductors while 10% oxygen/90% inert is desirable for processing of wires and thick films. Isothermal melt processing can be done in air.

In the experimentation described below, a concentration of 1 weight % $Al_2O_3$ was chosen in order to ensure that its effects would be noticeable. It is expected that the amount of alumina effective in practice of this invention will be less than about 5 weight % and, preferably, in the range of from about 0.1 to about 1.5 weight % of the mixture of Bi-2212 powder and alumina. 5 weight % alumina provides a mixture of about 2.6 weight % aluminum and 0.1 to 1.5% alumina corresponds to from about 0.05 to about 0.8 weight % of aluminum. Thick films on silver substrates and current leads were produced in experimentation for development of this invention. This experimentation demonstrates practice of the invention. Two powders of stoichiometries $Bi_2Sr_{2.15}CaO_{0.85}Cu_2O_y$ (designated Powder A) and $Bi_2Sr_2CaCu_2O_y$ (designated Powder B) were obtained from Seattle Specialty Ceramics. Powder B is Bi-2212. The composition of Powder A was specified to be outside the Bi-2212 region in order to investigate use of alumina additions and subsequent processing to bring a starting material outside of the Bi-2212 region into the region upon processing. A sufficient amount of aluminum oxide in particulate form was added to a quantity of each powder to form two mixtures, each containing 1% by weight of alumina. Each mixture was then heated to a temperature of about 1125° C. in order to completely melt it and then splat-quenched. Minimum temperature for melting is about 1000° C., since chemical changes occur as the material temperature is increased. Splat-quenching was accomplished by pouring the molten material on a flat surface and then striking the material with a metal anvil, causing the material to rapidly cool and solidify in particulate form. This operation produced from each mixture a glassy, or amorphous, substance in which all elements, including aluminum, were thoroughly mixed on the atomic level. Each splat-quenched material was then ground to form a powder. It is preferable that the powder have particle sizes of 25 microns or less.

Intimate mixing of the components effective for practice of this invention may also be accomplished by use of nanophase alumina having particle sizes of from about 0.1 to about 0.001 microns and particle sizes for the other component of about 10 microns or less.

A portion of the Powder A mixture was placed in a boat, or container, made of silver, which was placed in an oven at about 840° C. and containing an argon atmosphere for about 1 hour. Gas flow through the oven was then changed from argon to pure oxygen and the sample was held at the same temperature for an additional 99 hours. After the second hold period, the superconductive article was cooled to room temperature at an initial cooling rate of about 2° C. per second. The oxygen atmosphere and initial cooling rate were maintained until the article reached a sufficiently low temperature that degradation would not occur upon more rapid cooling and exposure to air. The dimensions of the article were about 10 cm×1 cm×0.5 cm thick. The thickness of the silver boat was about 0.025 mm. Current leads may be produced in this manner and used without removal of the body formed from processed powder from the boat. Of course, the superconducting body may also be utilized without the container. Critical current density ($J_c$) of this inventive article was found to be about 750 A/cm² (critical current was about 350 A) in liquid nitrogen and self-field. Another article was produced, for purposes of comparison to the inventive article, in the same manner from Powder A which was free of added alumina. The article produced from pure Powder A exhibited a critical current density of 280 A/cm² ($I_c$=186 A) in liquid nitrogen and self-field. Thus, practice of the invention improved $J_c$ by about 268%.

In examination of inventive articles and articles produced for the purpose of comparison to them, microstructure and phase identification were performed by scanning electron microscopy (SEM) with energy dispersive spectroscopy (EDS). Additional phase identification was by x-ray diffraction (XRD). Quantitative chemical analysis of the phases was carried out in the SEM apparatus with a glassy precursor standard whose cation composition was determined by inductively coupled plasma (ICP) analysis to be $Bi_{2.16}Sr_{1.93}Ca_{0.90}Cu_{2.01}O_y$. For secondary phases containing Al, a standard-less EDS analysis routine (Tracor-Northern) was used for approximate determinations of cation content.

Backscattered electron micrographs of a cross-section of the article made without alumina showed large grains of 1:1 alkaline earth cuprates ($Sr_{0.65}Ca_{0.33}Cu_{1.02}O_y$) throughout the sample. Very few of the 1:1 alkaline earth cuprate (AEC) grains had inclusions of CaO and many of the grains had round inclusions which were identified as a 2:3 Cu-free phase ($Bi_{1.99}Sr_{2.11}Ca_{0.81}Cu_{0.09}O_y$). Small grains of the 2:3 Cu-free phase and substantial amounts of a Bi-2201 phase were interspersed with the primary phase (Bi-2212). Bi-2201 ($Bi_2Sr_{2-x}Ca_xCuO_y$) is another superconducting phase of the BSCCO system. It exhibits superconducting properties only when its temperature is reduced to about 4 K. Bi-2201 is an undesirable material when it is mixed with Bi-2212, since the latter is a superconductor at higher temperatures (up to about 90 K). The 1:1 AEC and 2:3 Cu-free phase are not superconductive and adversely affect superconductive properties of an article. The composition of the Bi-2212 phase was $Bi_{2.18}Sr_{2.07}Ca_{0.74}Cu_{2.01}O_y$.

Significant differences were observed in the types and sizes of secondary phases, that is, non-superconducting phases, present in the article made from Powder A and alumina. A secondary phase observable at low magnification was identified as $Sr_{14-x}Ca_xCu_{24}O_{41}$ (14–24 phase). The amount of this phase was considerably smaller than that of the corresponding 1:1 AEC phase of the pure powder A article. The measured composition of the 14–24 phase was $Bi_{0.13}Sr_{9.20}Ca_{4.79}Cu_{23.88}O_y$. At higher magnification, the phases identified were Bi2212, Bi-2201, CuO, and two aluminate phases. The composition of the Bi-2212 phase was determined by quantitative analysis to be $Bi_{2.15}Sr_{2.06}Ca_{0.75}CU_{2.04}O_y$. Within the limits of EDS, no Al was detected within the Bi-2212 phase. The compositions of the aluminate phases were determined by semi-quantitative analysis to be $Bi_{0.10}Sr_{1.41}Ca_{0.50}Al_{1.00}O_y$ (2:1 alkaline earth aluminate phase) and $Bi_{1.95}Sr_{3.52}Ca_{0.50}Al_{3.03}O_y$ (2:4:3 phase). EDS analysis of submicron phases of the electron micrograph showed enrichment in Sr, Ca, and Al. Hence, these small, dark inclusions were assumed to be 2:1 alkaline earth aluminates (AEAs).

A portion of the splat-cooled and ground 1% alumina/Powder B mixture was mixed with isopropanol and dispersed on a silver substrate. After the isopropanol evaporated, leaving a thick film, the coated substrate was placed in an oven at about 820° C. and containing an argon atmosphere for about 1 hour. Gas flow through the oven was then changed from argon to 10% oxygen/argon to oxidize the thick film and form Bi-2212. The article was held in that mixture and at the same temperature for 14 hours. Then, the article was cooled at a rate of about 5° C./mm. The critical current density of the film was 120,000 A/cm$^2$ at 4 K and self-field. Another article was produced in the same manner from Powder B without added alumina; its $J_c$ was 37,000 A/cm$^2$ at 4 K and self-field. Thus, the invention provided a four-fold improvement.

Electron micrographs of the pure Powder B film showed large 1:1 alkaline earth cuprates with some having dimensions in excess of 100 microns. The film made from the alumina-containing mixture did not contain 1:1 AECs. The uncontrolled growth of 1:1 AECs in the pure powder B Film had a detrimental effect on subsequent phase development. An XRD scan indicated small amounts of Bi-2201 in the article with alumina addition and large amounts in the pure Powder B article. These observations were confirmed by backscattered electron micrographs. In one micrograph of the pure Powder B article, a combination of 1:1 AEC and Bi-2201 grains form a nearly-complete "wall" across the film. This wall has a highly deleterious effect on superconductive properties. EDS analysis of the pure article detected a 2:3 Cu-free phase; this phase was not present in the alumina article. In addition to Bi-2201, small amounts of 2:1 alkaline earth aluminates and CuO were present in the alumina article.

Additional experimental work was done in which portions of Powder A with and without alumina were partially melted at 850° C. for 1 hour in argon and either quenched into oil or cooled at about 10° C./min. The purpose was to investigate the effects of alumina addition at intermediate points in the complete process of producing an article of this invention. The phases and compositions identified in a sample without $Al_2O_3$ addition which was quenched from the melt were 2:3 Cu-free ($Bi_{1.99}Sr_{2.23}Ca_{0.77}Cu_{0.02}O_y$), an amorphous phase ($Bi_{1.24}Sr_{1.24}Ca_{0.33}Cu_{2.19}O_y$, cations normalized to 5), and CaO. All copper was contained within the amorphous phase. The size of the 2:3 Cu-free phase was generally in excess of 10 μm and typical sizes for CaO particles were 10 micron or less. The phases of a quenched sample with 1% $Al_2O_3$ were identified as 2:3 Cu-free ($Bi_{1.94}Sr_{2.13}Ca_{0.84}Cu_{0.09}O_y$), an amorphous phase ($Bi_{1.36}Sr_{1.31}Ca_{0.41}Cu_{1.92}O_y$, cations normalized to 5), CaO, and a 2:1 alkaline earth aluminate ($Bi_{0.02}Sr_{1.42}Ca_{0.56}Al_{1.0}O_y$). An unambiguous phase identification by XRD of the 2:1 AEA was not possible due to the small amounts of that phase in the sample. There were a few large grains (3–5 micron) of the 2:1 AEA from which EDS data could be taken with some confidence. However, the majority of the 2:1 AEA appeared to be present as submicron grains distributed within the amorphous and 2:3 Cu-free phases. It was assumed that the submicron grains were of the same type as the larger 2:1 AEA since EDS was able to show an enrichment of Al, Sr, and Ca when the submicron grains were probed. Almost all grains of the 2:3 Cu-free phase and CaO were below 10 microns in size.

Controlled solidification of the melts in Ar (rather than quenching) produced significant differences between the samples with and without $Al_2O_3$. Without $Al_2O_3$ addition, solidification results in formation of large 1:1 alkaline earth cuprates; many of these had CaO and 2:3 Cu-free grains embedded within them. Other phases identified in the pure Powder A sample were the 2:3 Cu-free phase, $Cu_2O/CuO$, and Bi-2201 in small amounts. Sample uniformity is improved by addition of alumina; there were no large 1:1 AECs in the sample to which alumina was added. The phases identified in the sample with alumina were 2:3 Cu-free, $Cu_2O/CuO$, CaO, 2:1 AEA, and Bi-2201 in small amounts.

The experimentation has shown that there are significant differences in the melting characteristics of nominal Bi-2212 material processed with and without $Al_2O_3$. These differences affect phase development and current transport properties of the superconductors. Controlling growth and nucleation of large non-superconducting 1:1 AECs is linked to limiting the size of the 2:3 Cu-free phase present in the partial melt. When the size of the latter phase is kept small by addition of $Al_2O_3$, large 1:1 AEC grains are not observed to nucleate on CaO particles. There appears to be a size above which the 2:3 Cu-free phase acquires a degree of metastability. This metastability reduces the reactivity of the phase and inhibits its role in conversion of the partial melt into the superconducting phase during oxidation. Because the 2:3 Cu-free phase contains only 3 of the 4 cations present in the system, reduced reactivity of this phase preferentially removes material from the system and allows the 1:1 AEC to nucleate and grow. If the size of the 2:3 Cu-free is kept small (as it is with $Al_2O_3$ addition), it remains completely reactive with the other phases in the melt and Bi2212 is readily formed upon oxidation of the melt. When conditions are favorable for the 1:1 AEC to form, its growth into large grains in excess of 100 μm is assisted by CaO particles in the partial melt. Once formed, the 1:1 AEC persists in fully processed samples even when it is not the equilibrium phase. Such is the case with the current lead type articles described above. The 14–24 phase is the equilibrium AEC that should be present at 840° C. in oxygen. Without $Al_2O_3$, however, it is the 1:1 AEC that is found in the current lead article. With $Al_2O_3$, the growth of 1:1 AECs is inhibited and the 14–24 AEC is found in the fully processed current lead article. At the microscopic level, compositions of the Bi-2212 phase of the alumina and non-alumina samples were found to be nearly the same. Within the limits of the EDS system used, no Al was found in the Bi2212. The differences between the alumina and non-alumina samples are in the types and amounts of phases surrounding the Bi-2212 phase. Without $Al_2O_3$ addition, samples were found to contain significant amounts of the Bi-2201 and 2:3 Cu-free phases. This is the result of a cycle of uncontrolled growth of one type of non-superconducting phase which preferentially removes material from the system and limits the development of the Bi-2212 phase. Without $Al_2O_3$ addition, the cycle starts with growth of the 2:3 Cu-free phase. When solidification of the partial melt begins upon oxidation, rapid growth of the 1:1 AEC occurs, leaving behind a Bi-rich matrix from which it is impossible to grow only Bi-2212. Other Bi-rich phases must develop in order to satisfy the mass balance of materials. Both XRD and SEM investigations of the samples processed without $Al_2O_3$ addition revealed significant amounts of Bi-2201 (40 mol. % Bi) and 2:3 Cu-free (40 mol. % Bi). With $Al_2O_3$ addition, no single non-superconducting phase is observed to rapidly grow and preferentially remove material from the system. There is a more uniform dispersion of much smaller secondary phases throughout the samples. Even though many of the secondary phases contain Al, the amount of material preferentially removed by the smaller aluminates is less than that removed by the 1:1 AECs. Bi-2201 is found in these samples, although in amounts much less than that which is formed in comparable samples without $Al_2O_3$ addition. Controlling grain sizes in the partial melt ends the cycle of preferential growth of non-superconducting phases and enables the system to reach equilibrium, as evidenced by the presence of the 14–24 phase in the current lead article. With $A_2O_3$ addition, equilibrium in the system includes the aluminates. The result is an increase in transport critical current densities at both liquid helium and nitrogen temperatures of samples.

In addition to splat-quenching, a molten Bi-2212 precursor with alumina may be cooled in any manner effective to form an amorphous solid, as opposed to a solid having a crystalline structure. For example, cooling may be done by quenching in oil or melt-spinning.

In certain chemical formulas, letter subscripts are herein used in place of numeric subscripts which indicate the number of molecules of oxygen. This is commonly done where the quantity of oxygen is dependent on the valence, or oxidation state, of the cations and therefore, cannot be exactly specified. Those skilled in the art are aware of the number of oxygen atoms required for the various valence states. In Bi-2212, $Bi_2Sr_2CaCu_2O_y$ is from about 7.5 to about 8.5.

What is claimed is:

1. A method of forming a superconductor article comprising:
   a. forming an intimate mixture of aluminum oxide and a material comprised of bismuth, strontium, calcium, copper, and oxygen, where the quantities of said components in said mixture are effective to form $Bi_2Sr_2CaCu_2O_y$, the amount of the aluminum oxide in the mixture being from about 0.1 to about 1.5 weight percent of the mixture;
   b. combining said mixture with a carrier to form an assembly; and,
   c. subjecting said assembly to conditions effective to melt process the mixture, thereby forming a superconducting article comprised of the $Bi_2Sr_2CaCu_2O_y$.

2. The method of claim 1 where y is from about 7.5 to about 8.5.

3. The method of claim 1 where said aluminum oxide has particle sizes of from about 0.001 to about 0.1 microns.

4. The method of claim 1 where said material comprised of bismuth, strontium, calcium, copper and oxygen has particle sizes of about 10 microns and below.

5. The method of claim 1 where, prior to combining the mixture with a carrier, the following steps are carried out:
   a. heating the mixture to a temperature effective to melt it thereby forming a molten mixture;
   b. cooling the molten mixture in a manner effective to form an amorphous material; and
   c. grinding said amorphous material to form a powder.

6. The method of claim 1 where said melt processing is comprised of:
   a. heating the assembly to a temperature within a range of from about 750 to about 860° C. in an inert gas atmosphere and holding it at a temperature within said range for from about 15 min. to about 25 hours;
   b. replacing said inert gas atmosphere with an atmosphere comprised of oxygen and holding the assembly at a temperature within the temperature range for from about 15 min. to about 200 hours; and
   c. cooling the assembly to room temperature.

7. The method of claim 1 where said melt processing is comprised of:
   a. heating the assembly to a temperature within a first temperature range of from about 880 to about 920° C. and holding it at a temperature within said first temperature range for from about 15 min. to about 25 hours;
   b. cooling the assembly at a cooling rate of from about 0.1 to about 5° C/min. to a temperature within a second temperature range of from about 820 to about 860° C.; holding the assembly at a temperature within said second temperature range for from about 1 to about 200 hours; and
   c. cooling the assembly to room temperature.

8. The method of claim 1 where said carrier is a silver or silver alloy tube which is filled with the mixture, sealed, and subjected to mechanical deformation before melt processing.

9. The method of claim 1 where said carrier is a substrate upon which the mixture is disposed to form a film.

10. The method of claim 1 where said carrier is a container and said superconducting article is the assembly or the body contained within the container.

11. The method of claim 5 wherein said molten mixture is cooled by quenching in a liquid.

12. The method of claim 5 wherein said molten mixture is splat cooled.

13. The method of claim 1 where said mixture is melted by heating it to a temperature of at least 1000° C.

* * * * *